Figure 1:
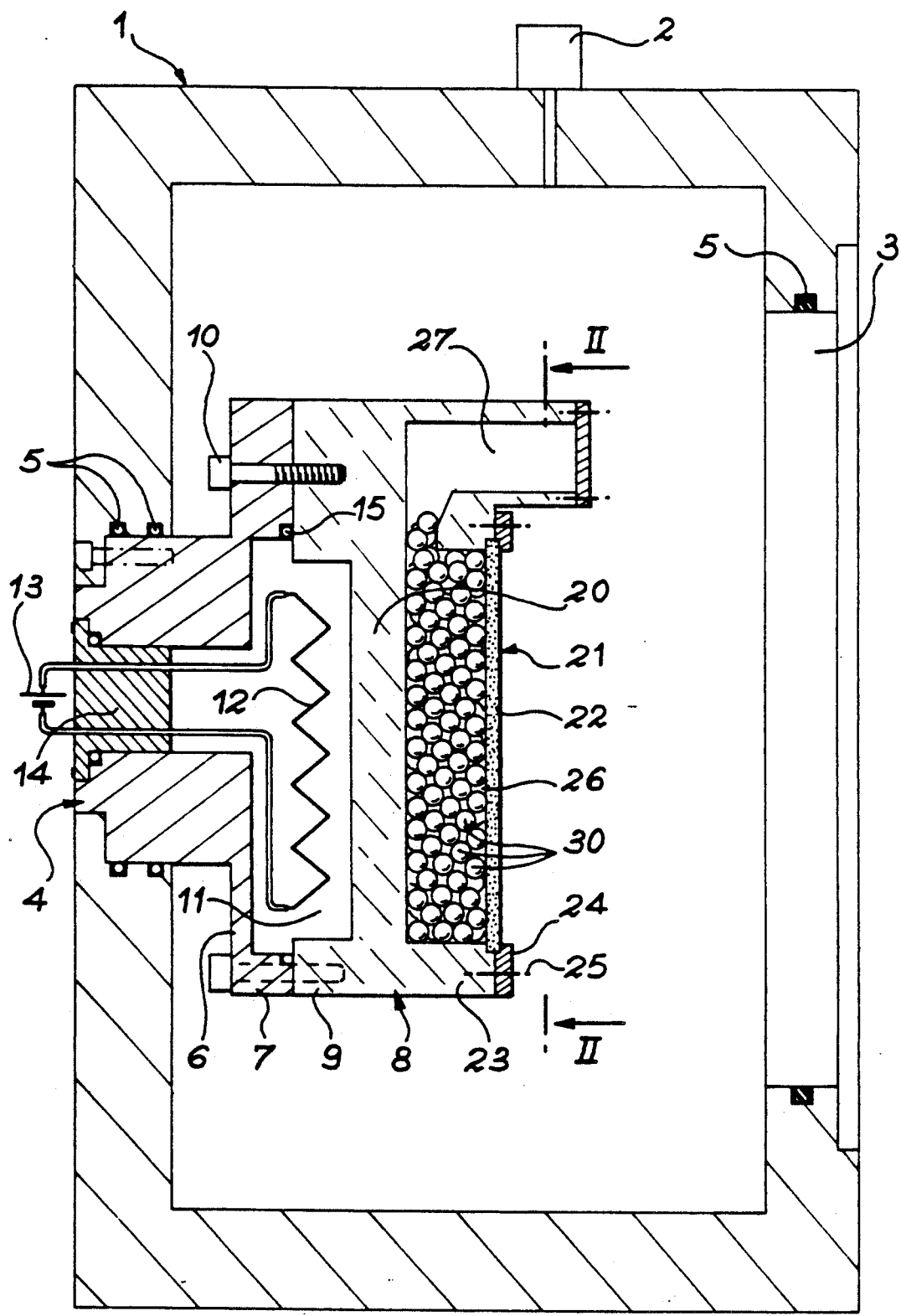

United States Patent [19]
Bechevet et al.

[11] Patent Number: 4,990,754
[45] Date of Patent: Feb. 5, 1991

[54] APPARATUS FOR TRANSMITTING HEAT UNDER VACUUM BY GRAINS

[75] Inventors: Bernard Bechevet, Claix; Claude Calvat, Saint Egreve; Bernard Rolland, Meylan; Bruno Valon, Grenoble, all of France

[73] Assignee: Commissariat A L'Energie Atomique, Paris, France

[21] Appl. No.: 346,731

[22] Filed: May 3, 1989

[30] Foreign Application Priority Data

May 20, 1988 [FR] France ................. 88 06781

[51] Int. Cl.[5] .............................................. H05B 3/06
[52] U.S. Cl. ................................ 219/530; 219/385; 219/399; 219/430; 219/540
[58] Field of Search ............... 219/385, 399, 430, 439, 219/462, 540, 530, 532, 526

[56] References Cited

U.S. PATENT DOCUMENTS

| | | | |
|---|---|---|---|
| 3,495,524 | 2/1970 | Miles | 219/399 |
| 4,481,406 | 11/1984 | Muka . | |
| 4,599,069 | 7/1986 | Murakami . | |
| 4,778,559 | 10/1988 | McNeilly | 219/530 |

FOREIGN PATENT DOCUMENTS 2239163 7/1973 France .

Primary Examiner—Roy N. Envall, Jr.
Attorney, Agent, or Firm—Pearne, Gordon, McCoy & Granger

[57] ABSTRACT

A heat transmission apparatus is formed between a thermal source (12) and an object (21) in a vacuum enclosure (1) by placing in a cavity defined by a heat emission wall (20) and the object (21), a granular material (30) which adapts to the thermal expansions, while permitting heating by conductivity under very good conditions.

Possible application to the manufacture of semiconductors and the crystallization of thin films.

5 Claims, 2 Drawing Sheets

APPARATUS FOR TRANSMITTING HEAT UNDER VACUUM BY GRAINS

DESCRIPTION

The present invention relates to an apparatus for transmitting heat under vacuum between a hot or cold thermal source and an object by means of intermediate grains placed between them.

In microelectronics or superconductors, there is often a need to carry out depositions or crystallizations under a vacuum at elevated temperature, e.g. of oxides or metals on thin film substrates. It may also be desirable to cool the substrate on which the films are deposited in order to inhibit their crystallization. In either case the problem is the same, i.e. ensuring the thermal transmission between a source and the substrate.

This transmission can take place by radiation, but this process if not generally very effective, particularly if the substrate on which the crystals are deposited is transparent to the radiation emitted by the thermal source. Transmission can also take place via solid support between the source and the substrate, which can comprise the frame on which the substrate is fixed for maintaining it in the center of the vacuum enclosure. However, this process is not efficient because the contact surfaces between the substrate and frame are not very large, and it is not possible to avoid the appearance of thermal gradients in the substrate, because the heat transmission is easier close to the frame.

Consideration has already been given to defining between the substrate and the source, within the vacuum enclosure, a tight subenclosure, into which is introduced a gas or optionally a liquid with a low vapour pressure.

A general inconvenience of such methods is that it is necessary to ensure sealing with respect to the vacuum enclosure, which is not easy when working at high temperatures for which the gaskets are not intended. In the case of liquefied solid substances, such as gallium or indium, it is necessary to accept a certain consumption of these expensive products and pollution is inevitable.

According to the invention these problems are obviated by placing between the substrate and the thermal source a particular material ensuring a uniform heat transmission along multiple paths, whilst leading to no sealing problem. More specifically, the present invention comprises a support in a vacuum enclosure provided with means for installing the object therein, the support, the object and a wall forming part of the thermal source, i.e. a heated or cooled wall defining a cavity filled with heat conducting grains. The thermal source can be of any appropriate type, such as a heating resistor located on the other side of the wall. This resistor is installed in another cavity, which can be filled with a thermally conducting, electrically insulating fluid.

It is also necessary for the grains to be sufficiently fine to ensure a good heat transmission uniformity between source and substrate, particularly as thermal variations can lead to irregular deformations to which the intermediate grains must adapt. Preference can therefore be given to the use of spherical balls with a diameter equal to or below 2 mm.

Moreover, it is possible to add to the vacuum enclosure, integral with the cavity and communicating therewith, a reservoir in which the grains are kept when there is no heating. It is then easily possible to install or remove the object to be heated without having to discharge the grains to the outside.

The invention is described in greater detail hereinafter relative to non-limitative embodiments and the attached drawings, wherein show:

FIG. 1 an overall section view of the apparatus.

Figure 2:
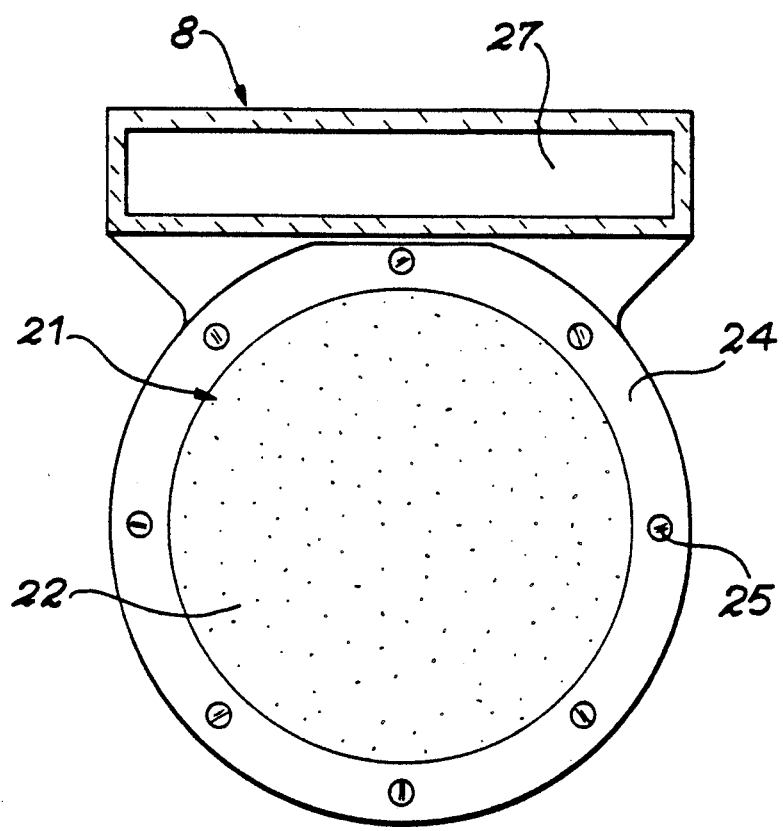

FIG. 2 a partial view along II—II of FIG. 1 and showing the configuration of the support of the object to be heated or cooled and in particular the grain reservoir.

In FIGS. 1 and 2, the vacuum enclosure is 1. The vacuum is established therein during operation by means of a vacuum pump 2 located outside enclosure 1 and issuing into the latter. Enclosure 1 also is provided with a door 3 having relatively large dimensions, and, on the opposite wall, a sleeve 4. Gaskets 5 are located at the breaks of enclosure 1.

Sleeve 4 widens to the inside of the vacuum enclosure 1 to form a ring 6 provided with a peripheral shoulder 7. It is here that is fixed the support 8 of the object to be heated or cooled by means of a complimentary periphery shoulder 9. Shoulder 7 and 9 are fixed by screws 10.

Sleeve 4 and support 8 then define a thermal source cavity 11 in which is located the thermal source 12, here constituted by a heating resistor. Other solutions are obviously possible and it would e.g. be possible to establish a forced circulation of heating or cooling fluid. Using resistor 12, the vacuum can prevail in the thermal source cavity 11 or to provide a better heat conduction, said cavity 11 can be filled with an electrically insulating fluid such as air. In the first case, it is necessary to bring about a seal by a plug 14 sealing the sleeve 4 between resistor 12 and its power supply 13. In the second case, the seal with respect to the vacuum enclosure 1 is brought about by placing a joint 15 between peripheral shoulders 7 and 9.

Wall 20 of support 8 in contact with the thermal source cavity 11 constitutes a heating or cooling base from which thermal energy is transmitted to the object located outside of the thermal source cavity 11. Said object is typically a planar substrate 21 mounted on support 8, kept parallel to and at a certain distance from wall 20, and an outer face 22 opposite to wall 20 supporting thin films which on having crystallization can occur.

The substrate 21 can be made from glass, quartz, silicon or gadolinium and gallium garnet, as well as thin films of barium hexaferrite, nitrides, borides, oxides, etc., without these lists being limitative.

The substrate 21 is kept in place between a peripheral bearing surface 23, which rises from wall 20, and a ring 24 fixed on the end of the peripheral bearing surface 23 by screws 25. Wall 20, substrate 21 and peripheral bearing surface 23 define a cavity 26. Substrates 21 is only in contact with bearing surface 23 and ring 24 over a limited width of its periphery and consequently does not create a seal between cavity 26 and the evacuated space within enclosure 1.

Cavity 26 is generally closed, except at one end, where it can advantageously issue onto a reservoir 27. During the treatment, the cavity 26 is filled with a heat conducting granular material, which can advantageously be formed by balls 30 having a diameter of about 1 mm. Reservoir 27 is then above cavity 26, so that the balls 30 tend to fill the latter with a pressure on its walls determined by the weight of the balls 30. If substrate 21 deforms as a result of its heating the balls 30 will redisperse and adapt to this shape change.

Moreover, the heat transmission from the wall 20 takes place by multiple sinuous thermal paths defined by contact points between balls 30 and takes place uniformly over the entire surface of substrate 21, even if there is a thermal gradient on wall 20, which permits more regular and greater heating effects than if the heat had to pass through the peripheral bearing surface 23.

These advantages also explain the superiority of the grains, such as balls 30, as compared with other intermediate solids which might have been adopted, e.g., rollers, studs or blocks which would not have been able to follow the thermal expansions of the substrate 21, would have been more difficult to install with correct tolerances, and would have produced less uniform heat transfer. Balls 30 are advantageously made from the same material as substrate 21, in order to avoid contact pollution.

In a specific example, it has been found that wall 20 was at 560° C. and that the temperature of the substrate 21 was raised by 130° C. when the balls 30 were introduced into cavity 26.

On completing the treatment, atmospheric pressure is reestablished in enclosure 1 and door 3 is removed. Screws 10 and then removed and it is possible to take away support 8. Substrate 21 is then removed on the outside by dismantling ring 24. Support 8 is turned over so as to place the reservoir 27 beneath cavity 26, so that balls 30 flow back into reservoir 37 and there is no need to worry about them further before removing substrate 21. The reverse operations are adopted for fitting a new substrate 21 in vacuum enclosure 1.

We claim:

1. Apparatus for transmitting heat from a thermal source to an object, the apparatus comprising an enclosure, means for creating vacuum in the enclosure, a circumferential support in the enclosure for receiving the object, means for clamping an edge of the object on the support, the thermal source comprising a wall, wherein the wall, the support and the object when received on the support define a cavity, and the apparatus further comprises heat conducting balls which fill the cavity between the wall and the object.

2. Apparatus according to claim 1, comprising a reservoir communicating with the cavity and in which the balls are forced by gravity, thus emptying the cavity, when the apparatus is capsized.

3. Apparatus according to claim 1, wherein the thermal source comprises a heating resistor.

4. Apparatus according to claim 3, comprising a second cavity partly defined by the wall, which contains the resistor and is filled with fluid.

5. Apparatus according to claim 1, wherein said object and balls are made of the same material.

* * * * *